United States Patent
Liu et al.

(10) Patent No.: US 6,677,242 B1
(45) Date of Patent: Jan. 13, 2004

(54) INTEGRATED SHALLOW TRENCH ISOLATION APPROACH

(75) Inventors: Wei Liu, San Jose, CA (US); Scott Williams, Sunnyvale, CA (US); Stephen Yuen, Santa Clara, CA (US); David Mui, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/637,838

(22) Filed: Aug. 12, 2000

(51) Int. Cl.[7] .......................................... H01L 21/302
(52) U.S. Cl. ...................... 438/706; 438/714; 438/719; 134/1.1; 134/1.2
(58) Field of Search ................................ 438/706, 689, 438/710, 712, 714, 719, 723, 724, 725; 134/1.1, 1.2

(56) References Cited

U.S. PATENT DOCUMENTS

| | | | | |
|---|---|---|---|---|
| 6,037,265 A | * | 3/2000 | Mui et al. | 438/719 |
| 6,037,266 A | | 3/2000 | Tao et al. | |
| 6,069,086 A | | 5/2000 | Nallan et al. | |
| 6,127,278 A | * | 10/2000 | Wang et al. | 438/719 |
| 6,171,970 B1 | * | 1/2001 | Xing et al. | 438/706 |
| 6,180,533 B1 | | 1/2001 | Jain et al. | |
| 6,221,772 B1 | * | 4/2001 | Yang et al. | 438/689 |
| 6,342,428 B1 | * | 1/2002 | Zheng et al. | 438/424 |
| 6,346,488 B1 | * | 2/2002 | Kabansky | 438/783 |

FOREIGN PATENT DOCUMENTS

| | | |
|---|---|---|
| EP | 0511448 | 11/1992 |
| JP | 02023615 | 1/1990 |
| JP | 2000150632 | 5/2000 |
| WO | WO 99/30359 | 6/1999 |
| WO | WO 00/14793 | 3/2000 |
| WO | WO 01/01468 | 1/2001 |

OTHER PUBLICATIONS

Wang et al. "In–Situ SHallow Trench Isolation Etch With Clean Chemistry," 23rd IEEE/CPMT International Electronics Manufacturing Technology Symposium, pp. 150–154, (1998).

* cited by examiner

*Primary Examiner*—Nadine G. Norton
*Assistant Examiner*—Duy-Vu Deo
(74) *Attorney, Agent, or Firm*—Townsend Townsend & Crew; Joseph Bach (57) ABSTRACT

A method for processing a silicon substrate disposed in a substrate process chamber includes transferring the substrate into the substrate process chamber. The substrate having a hard mask formed thereon and a patterned photoresist overlying the hard mask to expose portions of the hard mask. The chamber being the type having a source power system and a bias power system. The method further includes etching the exposed portions of the hard mask to expose portions of the silicon substrate underlying the hard mask. Thereafter, the patterned photoresist is exposed to a first plasma formed from a first process gas to remove the photoresist from the hard mask. Thereafter, the exposed silicon substrate is etched by exposing the substrate to a second plasma formed from a second process gas by applying RF energy from the source power system and biasing the plasma toward the substrate. The substrate is transferred out of the substrate processing chamber.

11 Claims, 6 Drawing Sheets

INTEGRATED SHALLOW TRENCH ISOLATION APPROACH

BACKGROUND OF THE INVENTION

The present invention relates to a method of etching silicon. More specifically, the present invention relates to an integrated silicon etch process including performing photoresist removal and silicon etch steps within the same chamber.

Today's semiconductor chips generally include millions of transistors. Isolation structures are provided between the transistors to prevent short circuit from occurring between adjacent transistors. One commonly used isolation structure is the shallow trench isolation (STI) structure. The STI structure has generally been made using an ex-situ hard mask STI or in-situ photoresist STI approaches.

The ex-situ hard mask approach generally involves forming a pad oxide layer and a silicon nitride layer successively over a silicon substrate. A photoresist layer is formed over the nitride layer and then patterned. The substrate is transferred to a first chamber to remove the exposed portions of the nitride and oxide layers thereunder. The substrate is then transferred to a second chamber to strip the photoresist. Thereafter, the substrate is transferred to a third chamber to etch the exposed portions of the silicon substrate to form trenches which will subsequently be filled with dielectric material, such as $SiO_2$, to produce shallow trench isolation structures. Each of the first, second and third chambers being optimized to perform its particular etching operation. One problem with this approach is that it requires at least three different etch chambers which increases the cost of ownership per wafer. In addition, transferring the substrates into and out of these three chambers reduces throughput and may cause particle and/or defect control problems.

Mindful of these disadvantages, the in-situ photoresist approach, which uses one less chamber than the ex-situ hard mask approach, has recently been gaining wider use. This process involves forming a pad oxide layer and a silicon nitride layer successively over a silicon substrate. A photoresist layer is formed over the nitride layer and then patterned. The substrate is transferred to a silicon etch chamber. The exposed portions of the nitride layer and the oxide layer thereunder are etched to expose selected portions of the silicon substrate. Afterwards, within the same chamber, the selected portions of the substrate are etched to form trenches. Then the substrate is transferred to a photoresist stripping chamber, such as the chamber, to strip the patterned photoresist.

Although the in-situ photoresist approach provides improved throughput and better particle/defect control management than the ex-situ hard mask approach, the former approach creates some problems of its own. One problem is that the photoresist becomes difficult to strip if removed after the silicon etch step since the byproducts, e.g., $SiO_2$, from silicon etch step are mixed with the remaining photoresist. Another problem is that the in-situ method results in increased profile micro-loading effects over the ex-situ hard mask step. The former generally has variance of 8–10 degrees or more for trenches targeted to have a taper angle of 85 degrees. In comparison, the latter generally produces variance of 3–5 degrees for the targeted structure. The profile micro-loading effect refers to the difference in trench taper angles of the dense areas and those in the iso areas. In addition, the in-situ photoresist approach also produces increased etch-rate micro-loading effect over the ex-situ hard mask approach. The former generally producing the etch rate depth variance of 300 Å or more for trenches etched to a depth of about 3,500 Å. In comparison, the latter has the etch rate depth variance of about 200 Å or less for the substantially same structure. The etch-rate micro loading effect refers to the difference in etch rate depths at the dense and iso areas.

Accordingly, it is desirable to develop a STI approach that can increase throughput and improve particle/defect control without the disadvantages associated with the in-situ photoresist step STI approach.

SUMMARY OF THE INVENTION

The present invention provides an improved method for etching silicon. Embodiments of the invention teaches performing photoresist stripping method and silicon etch steps within the same chamber. The present invention increases the throughput of silicon substrate processing.

According to one embodiment of the present invention, a method for processing a silicon substrate disposed in a substrate process chamber includes transferring the substrate into the substrate process chamber. The substrate having a hard mask formed thereon and a patterned photoresist overlying the hard mask to expose portions of the hard mask. The chamber being the type having a source power system and a bias power system. The method further includes etching the exposed portions of the hard mask to expose portions of the silicon substrate underlying the hard mask. Thereafter, the patterned photoresist is exposed to a first plasma formed from a first process gas to remove the photoresist from the hard mask. Thereafter, the exposed silicon substrate is etched by exposing the substrate to a second plasma formed from a second process gas by applying RF energy from the source power system and biasing the plasma toward the substrate. The substrate is transferred out of the substrate processing chamber.

These and other embodiments of the present invention, as well as its advantages and features, are described in more detail in conjunction with the text below and attached figures.

For a further understanding of the present invention, reference should be made to the ensuing detailed description.

DESCRIPTION OF THE SPECIFIC EMBODIMENTS

I. Exemplary Chamber

Figure 1A:
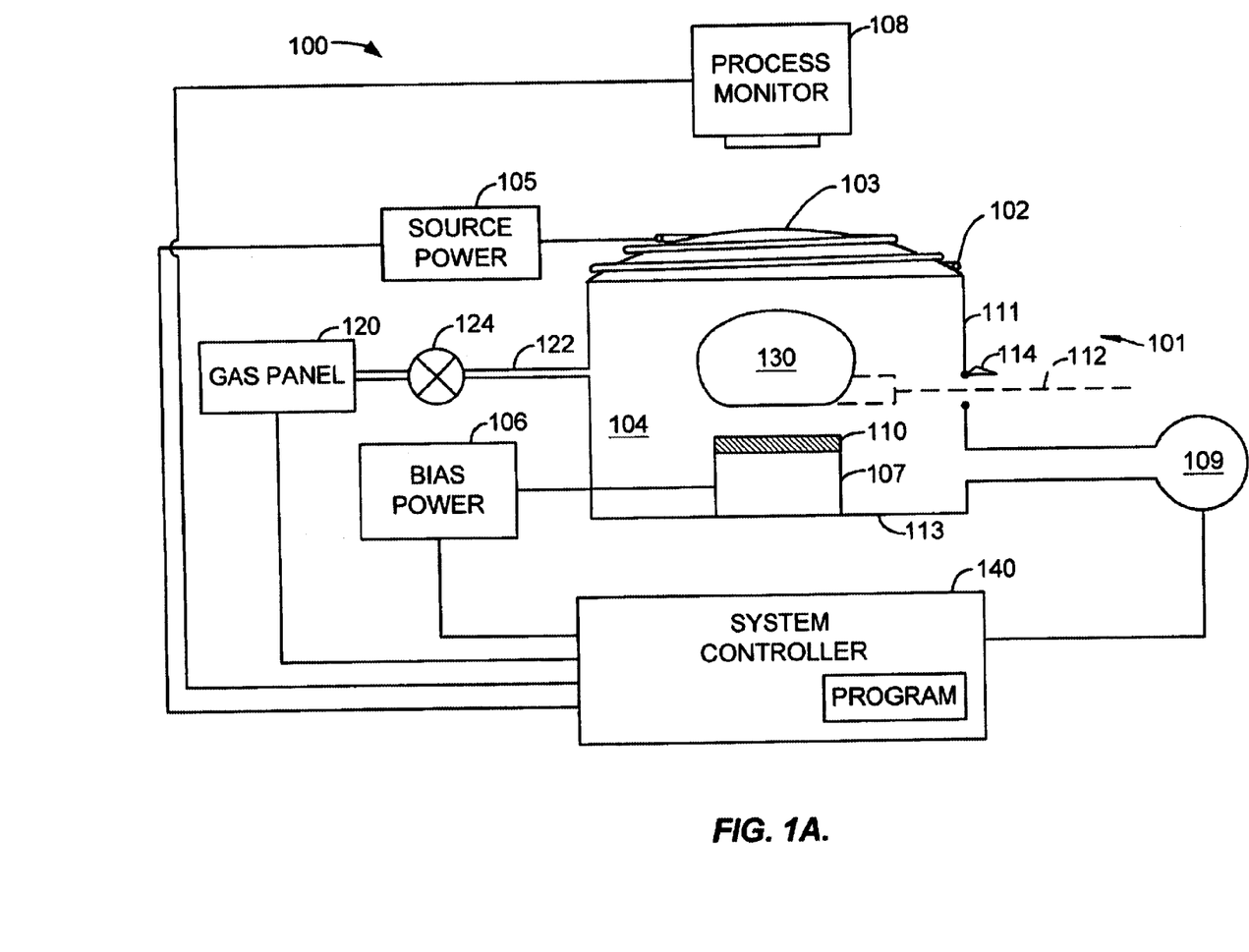
FIG. 1A shows a partial cross-sectional schematic of an exemplary semiconductor wafer processing system in which the method of the present invention may be implemented.

FIG. 1A depicts a schematic diagram of an exemplary semiconductor wafer processing system 100 in which the method of the present invention can be practiced. System 100 comprises a process chamber 101, a source power supply 105, a bias power supply 106 and a controller 140. Process chamber 101 comprises a process volume 104 defined by a dome 103, a cylindrical sidewall 111, and a bottom 113. Dome 103 is typically made of a dielectric material such as ceramic or quartz. Sidewall 111 and bottom 113 are typically made of a metal such as aluminum or stainless steel. Source power supply 105 couples an RF signal (e.g., 12.56 MHz) to an antenna 102. Antenna 102 has a plurality of turns located proximate the top 103 and produces RF electromagnetic fields that excite a process gas (or gases) located in volume 104 to form and/or sustain a plasma 130.

A robot arm 112, shown in phantom, transfers the wafers 110 in and out of process chamber 101 through a slit valve 114. During substrate processing, a semiconductor wafer 110, which may contain partially formed integrated circuit structures, is supported upon a pedestal (electrostatic chuck) 107. Wafer 110 is exposed to the plasma to facilitate processing. Ions and electrons from the plasma 130 bombard the wafer 110. Since the electrons are more mobile than the ion, more electrons than ions strike the wafer. As a result wafer 110 acquires a negative bias. The negative bias accelerates positive ions from the plasma towards wafer 110. Pedestal 107 and thus the wafer is biased by an RF signal (e.g., 400 KHz or 13.56 MHz) supplied to pedestal 107 by bias power supply 106. The density of ions in plasma 130 is primarily controlled by the signal applied to antenna 102, while the energy of the ions is primarily controlled by the signal applied to pedestal 107.

Temperature within chamber 101 is partly controlled by circulating a fluid (e.g., water-based ethylene glycol) through separate heat exchange passages (not shown) within sidewall 111 and dome 103 of the chamber. Temperature of the substrate being etched is controlled by a combination of a gas applied to the backside of the substrate through passages (not shown) within pedestal 107 and by circulating a fluid through a heat exchange passage (not shown) within the pedestal.

A process monitor 108 monitors conditions within process chamber 101. The process monitor can be any sensor, or combination of sensors, for measuring a condition that is dependent on the process occurring within chamber 101. By way of example, process monitor 108 is an Optical Emission Spectrometer (OES). The OES monitors emission of radiation from plasma 130. Such radiation is dependent on the progress of the process occurring in process chamber 101. Alternatively, process monitor 108 could include an interferometer for measuring elevations such as the depth of trenches etched into a surface of the wafer 110. Such an interferometer measures the depth of the trenches by interference of light reflected from the top and bottom of the trenches. If process monitor 108 is an OES or interferometer, radiation from within chamber 101 is coupled to the process monitor through a transparent aperture such as sapphire or quartz top 103. Alternatively a separate window can be provided in top 103 or sidewall 111 for this purpose.

Process monitor 108 and various components of system 100 are coupled to controller 140. Controller 140 includes hardware to provide the necessary signals to initiate, monitor, regulate, and terminate the processes occurring in process chamber 101. Process chamber 101 is, for example, a decoupled plasma source (DPS) etch chamber manufactured by Applied Materials of Santa Clara, Calif. Chamber 101 contains the elements necessary to process a semiconductor wafer.

The exterior of chamber 101 is typically at ambient atmospheric pressure and the interior of chamber 101 is held at a reduced pressure during processing. An exhaust system 109 regulates the pressure within chamber 101. A gas panel 120 delivers process gases to chamber 101 via a gas line 122 and a valve 124. In a process, such as an etch process, plasma 130 is formed in the chamber 101 by applying RF power to the process gas. RF power source 105 energizes antenna 102 to ignite and sustain the plasma within chamber 101. Those skilled in the art will realize that a plurality of steps is necessary to excite a plasma in a process chamber, i.e., supply a process gas, apply source power to the antenna, apply bias power to the pedestal and so on. These steps are within the skill of an ordinary practitioner in the art to perform without further explanation.

Figure 1B:
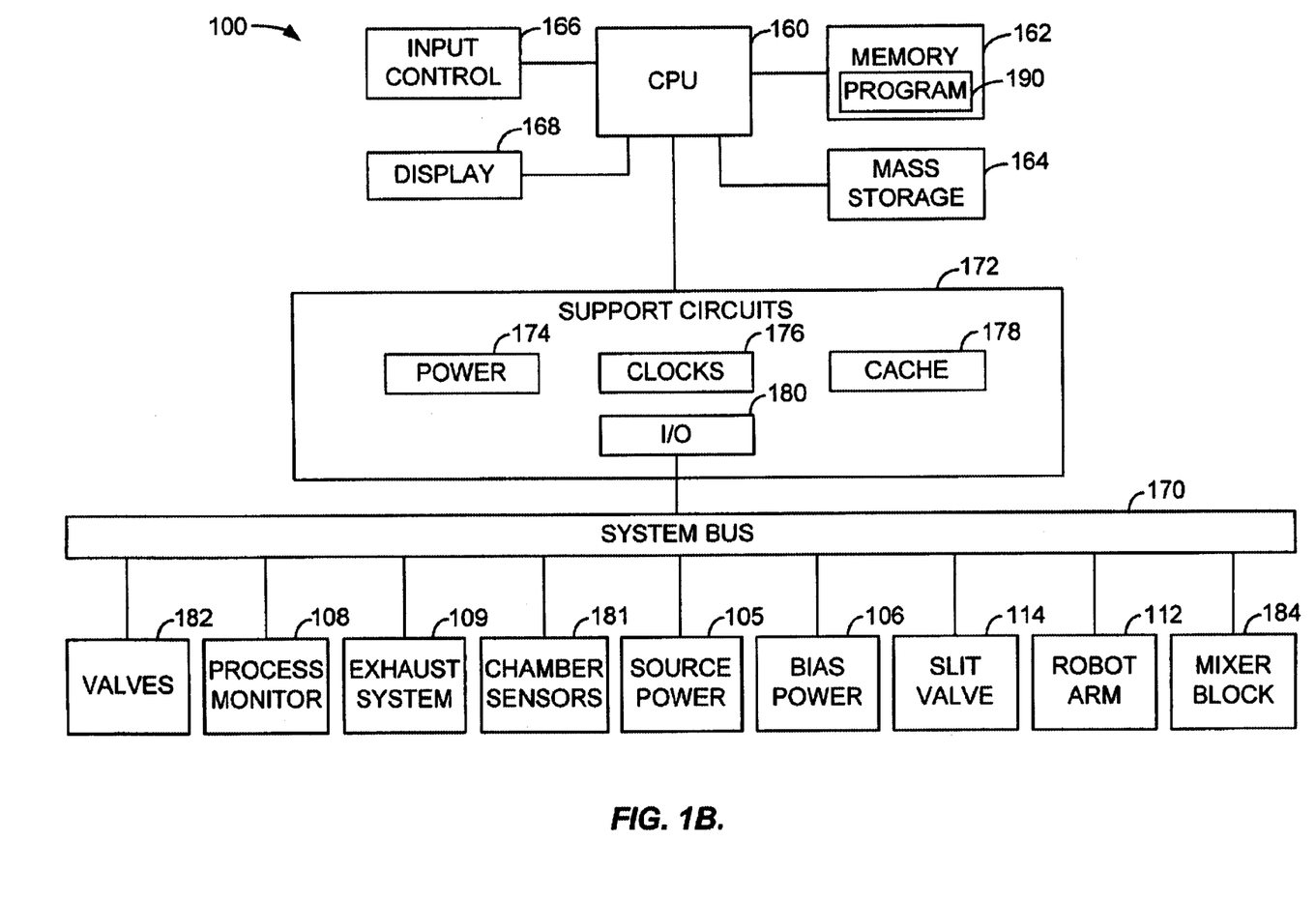
FIG. 1B shows a block diagram of the semiconductor wafer processing system of FIG. 1A.

The method of the present invention can be implemented in a system that is controlled by a processor-based system controller such as controller 140 of FIG. 1A. FIG. 1B shows a block diagram of a processing system 100, such as that depicted in FIG. 1A, having such a system controller 140 that can be employed in such a capacity. System controller unit 140 includes a programmable central processing unit (CPU) 160 that is operable with a computer-readable memory 162, a mass storage device 164, an input control unit 166, and a display unit 168. The system controller further includes well-known support circuits 172 such as power supplies 174, clocks 176, cache 178, input/output (I/O) circuits 180 and the like. Controller 140 also includes hardware for monitoring wafer processing through sensors 181 in chamber 101. Such sensors measure system parameters such as wafer temperature, chamber atmosphere pressure and the like. All of the above elements are coupled to a control system bus 170.

Memory 162 contains instructions that CPU 160 executes to control the operation of processing system 158. The instructions in memory 162 are in the form of program code such as a program 190 that implements the method of the present invention. The program code may conform to any one of a number of different programming languages. For example, the program code can be written in C, C++, BASIC, Pascal, or a number of other languages. Computer program 190 may include a number of different subroutines. For example, in one specific embodiment, program 190 includes a process selection subroutine, a process sequencer subroutine and chamber manager subroutines for each chamber in a multichamber system. Program 190 also includes subroutines to control individual components of each chamber 101, including, for example, a substrate positioning subroutine, a process gas control subroutine, a pressure control subroutine, a temperature control subroutine, and a plasma control subroutine among others. Those having ordinary skill in the art will readily recognize that other chamber control subroutines can be included depending on what processes are to be performed in process chamber 101.

The process selection subroutine identifies (i) the desired process chamber (if chamber 101 is part of a multichamber processing system) and (ii) the desired set of process parameters needed to operate the process chamber for performing the desired process. The process parameters for performing a specific process relate to process conditions such as, process gas composition and flow rates, temperature, pressure, plasma conditions such as RF power levels and the low frequency RF frequency, cooling gas pressure, and chamber wall temperature. These parameters are provided to the user in the form of a recipe and can be entered using input control interface 166.

The process sequencer subroutine includes program code for accepting the identified process chamber and set of process parameters from the process selector subroutine and for controlling operation of the various process chambers in a multichamber system. Multiple users can enter process set numbers and process chamber numbers, or a user can enter multiple process set numbers and process chamber numbers, so the sequencer subroutine operates to schedule the selected processes in the desired sequence. Preferably, the sequencer subroutine includes program code to (i) monitor the operation of the process chambers to determine if the chambers are being used, (ii) determine what processes are being carried out in the chambers being used, and (iii) execute the desired process based on availability of a process chamber and type of process to be carried out. Conventional methods of monitoring the process chambers can be used, such as polling. When scheduling which process is to be executed, the sequencer subroutine can take into consideration the present condition of the process chamber being used in comparison with the desired process conditions for a selected process, or the "age" of each particular user-entered request, or any other relevant factor a system programmer desires to include for determining scheduling priorities.

Once the sequencer subroutine determines which process chamber and process set combination is going to be executed next, the sequencer subroutine initiates execution of the process set by passing the particular process set parameters to a particular chamber manager subroutine that controls multiple processing tasks in the particular process chamber according to the process set determined by the sequencer subroutine. In operation, the chamber manager subroutine selectively schedules or calls the process component subroutines in accordance with the particular process set being executed. Typically, the chamber manager subroutine monitors the various chamber components, determines which components need to be operated based on the process parameters for the process set to be executed, and initiates execution of individual chamber component subroutines responsive to the monitoring and determining steps.

A person of ordinary skill in the art would understand how to implement each of the particular chamber component subroutines. For example, the substrate positioning subroutine would include program code for controlling chamber components that are used to load the substrate onto pedestal 107 and, optionally, to lift the pedestal and substrate to a desired height in chamber 101 for substrate processing.

Mass storage device 164 stores data and instructions and retrieves data and program code instructions from a processor readable storage medium, such as a magnetic disk or magnetic tape. For example, the mass storage device 164 can be a hard disk drive, floppy disk drive, tape drive, or optical disk drive. Mass storage device 164 stores and retrieves the instructions in response to directions that it receives from the CPU 160. Data and program code instructions that are stored and retrieved by mass storage device 164 are employed by processor unit 160 for operating the processing system 100. The data and program code instructions are first retrieved by the mass storage device 164 from a medium and then transferred to memory 162 for use by CPU 160.

Input control unit 166 couples a data input device, such as a keyboard, mouse, or light pen, to processor unit 160 to provide for the receipt of a chamber operator's inputs. Display unit 168 provides information to a chamber operator in the form of graphical displays and alphanumeric characters under control of CPU 160.

Control system bus 170 provides for the transfer of data and control signals between all of the devices that are coupled to the control system bus 170. Although the control system bus is displayed as a single bus that directly connects the devices in CPU 160, control system bus 170 can also be a collection of busses. For example, display unit 168, input control unit 166 and mass storage device 164 can be coupled to an input-output peripheral bus, while CPU 160 and memory 162 are coupled to a local processor bus. The local processor bus and input-output peripheral bus are coupled together to form control system bus 170.

System controller 140 is coupled to the elements of the processing system 100, employed in etch processes in accordance with the present invention via system bus 170 and I/O circuits 180. These elements include a plurality of valves 182 (such as valve 124 of FIG. 1A), process monitor 108, exhaust system 109, source power supply 105, bias power supply 106, slit valve 114, gas panel 120, robot arm 112, chamber sensors 181 and an optional mixer block 184 (not shown in FIG. 1A, but may be connected to either the gas panel 120 or chamber 101).

System controller 140 provides signals to the various chamber elements that cause these elements to perform desired operations in order to implement a desired process in chamber 101.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, in software, hardware, or both. Those skilled in the art will also realize that it would be a matter of routine skill to select an appropriate computer system to control substrate processing system 100.

II. Silicon Processing According to the Present Invention

The method of the present invention can be used to etch silicon for a variety of applications in appropriate substrate processing chambers such as the exemplary chamber described above. However, for illustrative purposes, the present invention is described below in conjunction with the steps involved in etching trenches in a silicon substrate for a shallow trench isolation process. Where applicable, reference numbers in the description below are used to refer to appropriate components of the exemplary chamber shown in FIGS. 1A and 1B.

Referring to FIGS. 2A–2E and FIG. 3, a process 200 (FIG. 3) includes placing a substrate 50 (FIG. 2A) on pedestal 107 of process chamber 101, i.e., a silicon etch chamber (step 201). The substrate has a pad oxide layer 52 provided thereon, a hard mask layer 53, e.g., a silicon nitride layer, provided over the pad oxide, and a patterned photoresist 54 provided over the hard mask layer by well-known techniques. The pad oxide layer is generally formed on the substrate to provide a good adhesive surface for the hard mask layer. In one embodiment, the substrate may include a dielectric layer such as an anti-reflective coating layer (not shown) between hard mask layer 53 and pad oxide layer 52.

Figure 2A:
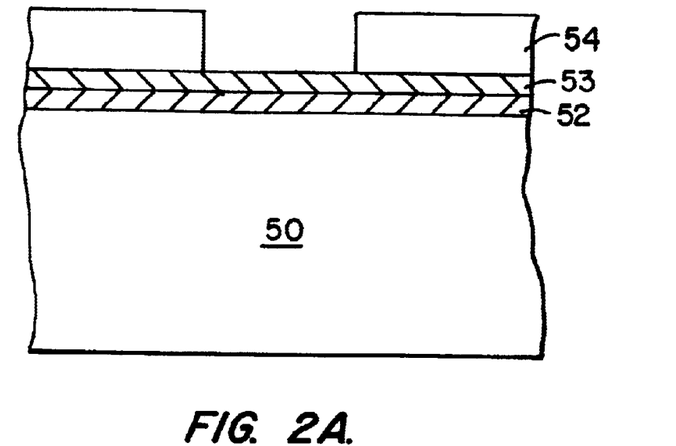
FIG. 2A shows a simplified cross-sectional view of a semiconductor substrate having a patterned photoresist layer
Figure 2B:
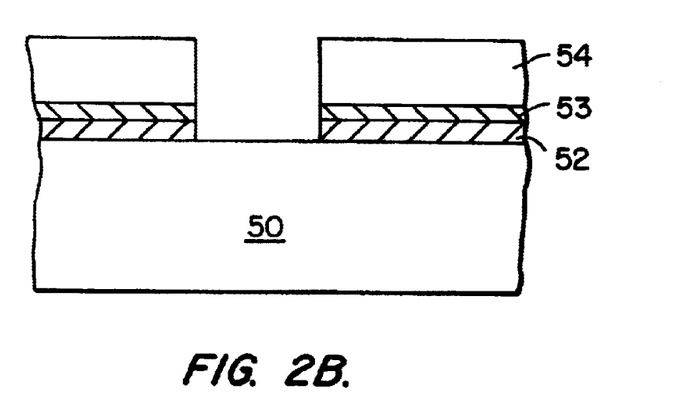
FIG. 2B shows a simplified cross-sectional view of the semiconductor substrate of FIG. 2A after the hard mask and oxide have been opened.

Referring to FIG. 2B, once the substrate has been inserted into the chamber, hard mask layer 53 is opened to expose the pad oxide layer thereunder (step 202). Generally, anisotropic etch technique is used to remove selected portions of the hard mask layer. Portions of pad oxide 52 exposed by step 202 are removed to expose the silicon substrate (step 204). The process recipes used for the nitride and oxide open steps, according to one embodiment of the present invention, are provided below in Tables 1 and 2, respectively. In Tables 1 and 2, $W_b$ represents the bias power applied by bias power supply 106, $W_s$ represents source power supplied by source power supply 105, and Pressure represents the pressure within the chamber during the etch process. In the nitride-open step, the end point detection is used to determine the duration of the step; i.e., the step is performed until the underlying oxide layer is detected by an end-point detection system.

TABLE 1

| Process Recipe | |
|---|---|
| Nitride Open | |
| Pressure | 25 mT |
| $W_b$ | 250 Watts (0.8 Watt/cm$^2$) |
| $W_s$ | 700 Watts |
| SF$_6$ | 10 sccm |
| CHF$_3$ | 100 sccm |
| Time | end point detection |

TABLE 2

| Process Recipe | |
|---|---|
| Oxide Open | |
| Pressure | 30 mT |
| $W_b$ | 50 Watts (0.16 Watt/cm$^2$) |
| $W_s$ | 750 Watts |
| CF$_4$ | 80 sccm |
| Ar | 120 sccm |
| Time | 15–25 sec |

The process recipe provided above for the nitride-open step has a nitride-to-photoresist selectivity ratio of about 1.3:1, where the nitride layer is removed 1.3 times faster than the photoresist. For example, for nitride layer 53 with thickness of 1500 Å, the patterned photoresist layer is required to have minimum thickness of about 1154 Å. Preferably, photoresist layer 54 has additional thickness of 500–900 Å to compensate for faceting phenomena. Accordingly, in one embodiment, photoresist layer 54 initially has thickness of about 1650 Å to about 2150 Å to open nitride layer with thickness of 1500 Å. After the nitride-open step 202, the photoresist remaining on the hard mask would have in general a thickness of about 500–900 Å. Once the nitride layer is opened, the remaining photoresist layer is not needed to open the underlying oxide layer in some cases since the nitride layer may be used in place of the photoresist layer. In another embodiment, photoresist layer 54 initially has a thickness of about 2300–3500 Å, preferably about 3000 Å, to open the underlying nitride and oxide layers with the photoresist layer. The thickness of the photoresist layer can be kept to minimum under specific embodiments of the present invention since the photoresist layer is stripped prior to etching trenches on the silicon substrate.

Under the conventional in-situ photoresist approach, however, a much thicker photoresist layer is required since the photoresist is left on the nitride layer and used to etch trenches on the silicon substrate. Typically, additional 2000 Å or more of photoresist is needed to etch trenches having depth of about 3000 Å under the conventional in-situ approach. For example, to form a trench having depth of about 3000 Å on a silicon substrate which has thereon nitride and oxide layers of 1500 Å and 100 Å, respectively, the conventional approach uses the photoresist layer with thickness of 5000 Å or more. Such a conventional approach is particularly difficult to implement as the devices progress to 0.18 μm or smaller since the aspect ratio of the photoresist pattern increases as the device size decreases. Eventually, the conventional in-situ photoresist approach would reach its process limitation and could no longer be used to fabricate small devices, e.g., 0.13 μm device, due to the depth of focus constraint in the photolithography procedure.

In comparison, the in-situ hard mask approach under specific embodiments of the present invention allows the use of a photoresist layer having a thickness of 3000 Å or less, as explained above. Consequently, the decrease in device size is offset by the decrease in photoresist thickness, thereby slowing or preventing the increase in the aspect ratio of photoresist patterns as the devices get smaller. Therefore, in-situ hard mask approach according to the present invention may be reliably used to process devices having minimum feature sizes of 0.18 μm, 0.13 μm and even smaller.

Figure 2C:
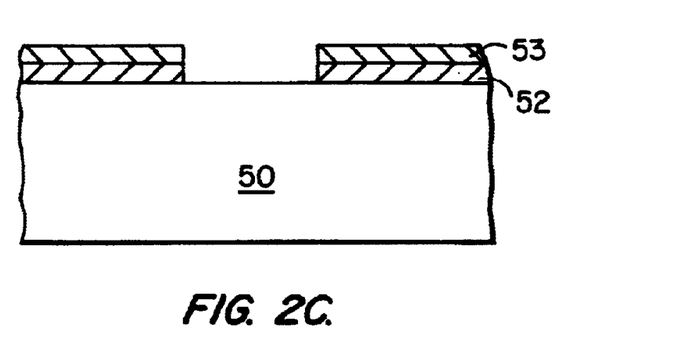
FIG. 2C shows a simplified cross-sectional view of the semiconductor substrate of FIG. 2B after the photoresist has been stripped.

Referring to FIG. 2C, after opening the hard mask and pad oxide layers, the remaining photoresist layer is stripped in-situ using a plasma ignited from oxygen gas, i.e., stripped without removing the substrate from the silicon etch chamber (step 206). This is contrary to the conventional wisdom. Generally, photoresist is stripped ex-situ in a special resist-stripping chamber (downstream chamber) by exposing the photoresist mostly to reactive radicals rather than exposing it directly to plasma, because of the concern over causing damages to the structures on the substrate. Therefore, the concept of stripping photoresist in-situ in the silicon etch chamber by directly exposing the resist to plasma has generally been considered impractical by process engineers. Another reason for stripping photoresist ex-situ is because the photoresist have had until recently relatively high metal impurity level. Consequently, a serious metal contamination problem may arise if the resist is stripped in-situ in the etch chamber. In addition to the above, the process engineers have shied away from the in-situ resist stripping approach because of the concern over stripping the resist in the same chamber where "dirty" etch process is performed. The dirty process, such as silicon etch step, produces byproducts (SiO) which may mix with the resist and make the resist stripping difficult to perform or cause particle control problem. For these and other reasons, the photoresist has been stripped ex-situ in a special chamber under the conventional STI approaches. For example, in the conventional hard mask approach, the photoresist is stripped in another chamber before inserting the substrate into the silicon etch chamber, whereas in the conventional in-situ photoresist approach, the photoresist is stripped in another chamber after the silicon etch step.

Figure 3:
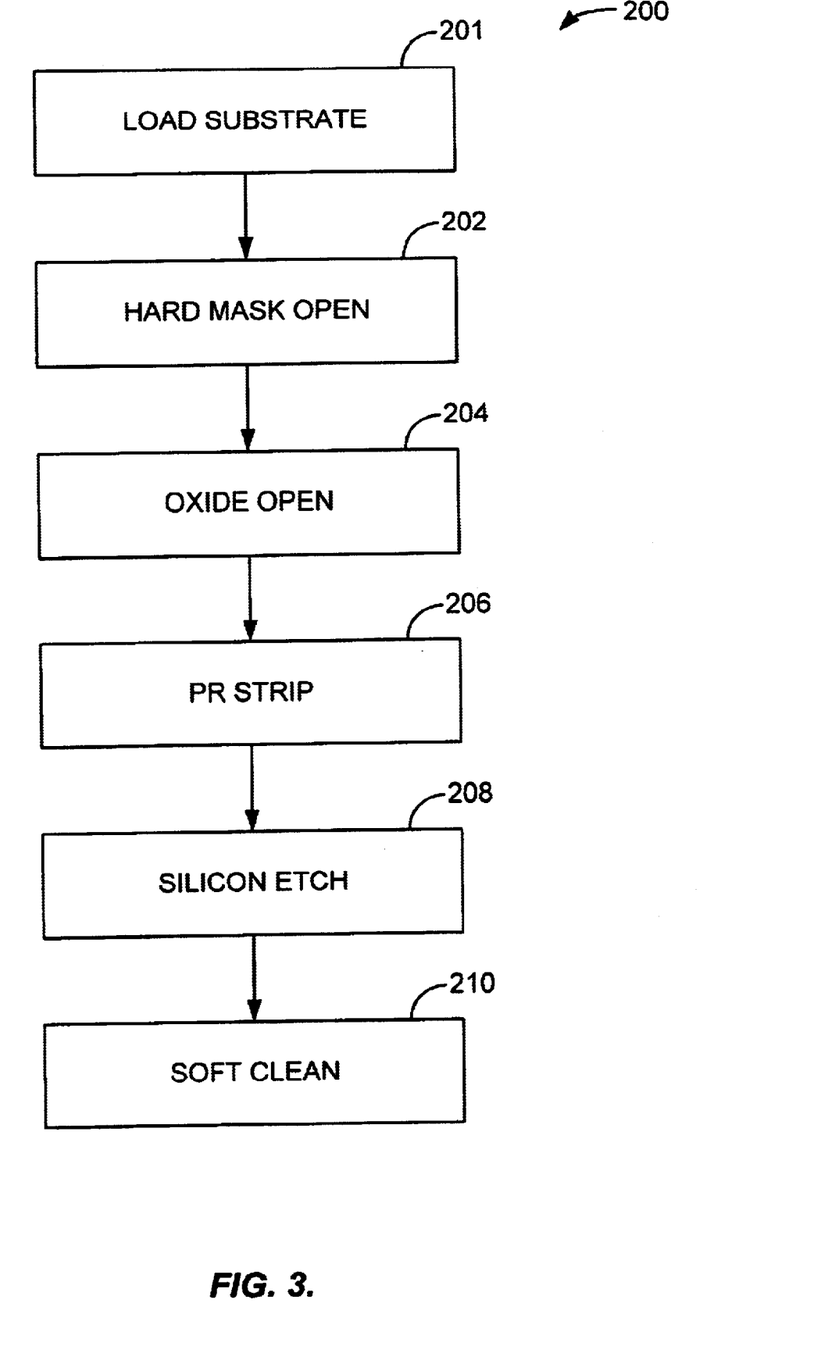
FIG. 3 shows a flow chart of an exemplary process according to one embodiment of the present invention.

However, contrary to the conventional wisdom, the present inventors have unexpectedly discovered that it is possible to implement process 200 which strips the photoresist layer within the same chamber where silicon etch step is performed. That is, the resist is stripped in-situ prior to performing the silicon etch step. In process 200, the damage issue is of little concern since the underlying nitride layer is later removed in STI processes. The contamination issue is also of little concern since the purity level of photoresist has significantly increased recently. Finally, the concern over byproducts mixing with the photoresist also have been addressed, as explained below.

According to one embodiment of the present invention, the silicon etch chamber is kept substantially free of byproducts or polymer ($SiO_2$) by frequently performing cleaning steps, e.g., performing a dry clean step every one load. Also, relatively clean silicon etch steps may be incorporated into process 200 to reduce polymer build-up on the chamber walls. An example of such a step involves use of an etchant gas such as $SF_6$ in a process gas. Alternatively or in addition to the above measures, a soft clean step may be incorporated into process 200, as explained in more details later, to reduce polymer build-up on the chamber walls and facilitate extended process runs under process 200. As used herein, the term "substantially free of polymers" refers to a condition where the amount of polymer build-upon the chamber walls is not great enough to threaten the reliability of process 200. As will be understood by a person skilled in the art, such a condition will vary depending on the chamber being used, the process being performed and the like.

Returning back to step 206, the process recipe used for the photoresist stripping step, according to one embodiment of the present invention, is provided below in Table 3. In Table 3, $W_b$ represents the bias power applied by bias power supply 106, $W_s$ represents source power supplied by source power supply 105, and Pressure represents the pressure within the chamber during the etch process. The stripping step is performed for a particular period, where the period is a combination of the time it takes to reach underlying nitride layer 53 plus forty percent of that time for over etching purposes. For example, if the underlying layer is detected in 10 seconds using an end-point detection system, the process is performed for another 4 seconds thereafter for over etching purposes.

The process recipe provided below in Table 3 is an exemplary process recipe. Many other process recipes may be used to strip the photoresist. In one embodiment, the chamber pressure may be between about 2 mT to about 100 mT, the bias power may be 0 Watt to about 100 Watts, the source power may be about 200 Watts to about 2000 Watts, and the oxygen flow may be about 5 sccm to about 500 sccm. In another embodiment, in addition to oxygen, inert gas such as helium, nitride, or argon, or a combination thereof may be flowed into the chamber.

TABLE 3

Process Recipe

Photoresist Stripping

| | |
|---|---|
| Pressure | 10 mT |
| $W_b$ | 20 Watts (0.07 Watts/cm$^2$) |
| $W_s$ | 1000 Watts |
| $O_2$ | 50 sccm |
| Time | end point detection + 40% over etch |

Figure 2D:
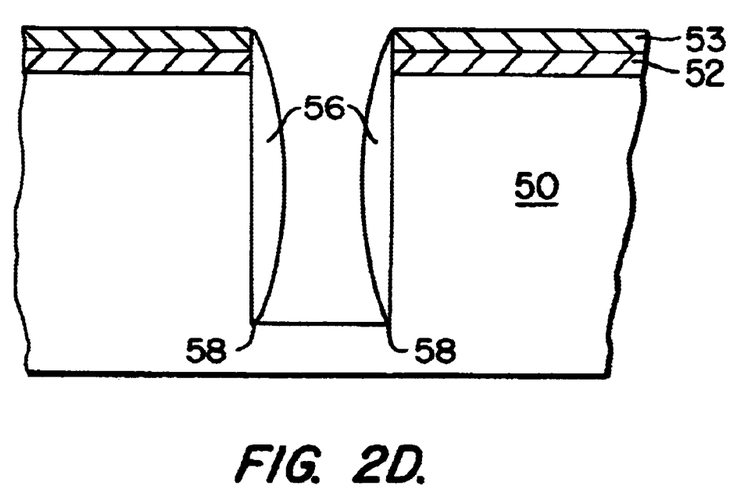
FIG. 2D shows a simplified cross-sectional view of the semiconductor substrate of FIG. 2C after a trench has been etched thereon.

After the photoresist has been stripped, a trench is etched in-situ using a well-known anisotropic etch technique (step 208), as shown in FIG. 2D. The anisotropic etch technique involves applying a bias power to direct the ions vertically toward the substrate and flowing polymer-forming gases such as oxygen into chamber 101 to form a passivation layer 56 on the walls of the trench as the trench is being etched. Generally the plasma is biased at about 300 Watts (0.96 Watts/cm$^2$) in order to accelerate the ions vertically toward the substrate. The passivation layer generally tapers off at bottom corners 58 of the trench; i.e., the passivation layer is thicker at the upper sidewalls than the at the lower sidewalls.

The process recipe for one implementation of the trench etch process that uses an etchant gas consisting of $Cl_{2\ and\ O2}$ to etch a trench having depth of about 3,000 Å is provided in Table 4 below.

TABLE 4

Process Recipe

| | Trench Etch |
|---|---|
| Pressure | 35 mT |
| $W_b$ | 300 Watts (0.96 Watts/cm$^2$) |
| $W_s$ | 1000 Watts |
| $Cl_2$ | 90 sccm |
| $O_2$ | 12 sccm |
| Time | 28 sec |

The anisotropic etch process of step 208, is generally referred to as a dirty process because the polymerization and ion bombardment produce byproducts which adhere to the inner surfaces of chamber 101. These byproducts accumulate within the chamber and alter the chamber condition unless they are regularly removed. Additionally, the ion bombardment damages crystal structure at the outer surfaces of the substrate, producing a damaged layer (not shown in FIG. 2D) with a thickness of 20–100 Å, which alters the electrical properties of the substrate among other things.

The present inventors have discovered that one method of maintaining the chamber clean for extended process runs is to incorporate a soft clean step (step 210) into process 200. The soft clean step removes the byproducts adhering to the inner surfaces of the chamber without meaningfully altering the main trench profile, i.e., the width (opening), depth and slope of the trench. Under the conventional paradigm of semiconductor fabrication process, engineers perform cleaning steps on the chamber only after removing the substrate being processed from the chamber for the fear of altering the profile etched and damaging the substrate. The present inventors, however, have unexpectedly discovered that integrating the soft clean step to the silicon etch process, i.e., performing the soft clean step with the substrate in the chamber, provides many unexpected benefits. For example, the integrated etch process discovered by the inventors allows a greater number of substrates (10,000 or more in some cases) to be processed between wet clean steps than under the conventional method. In addition, in some instances, the soft clean step may even alleviate the need for dry clean steps.

Figure 2E:
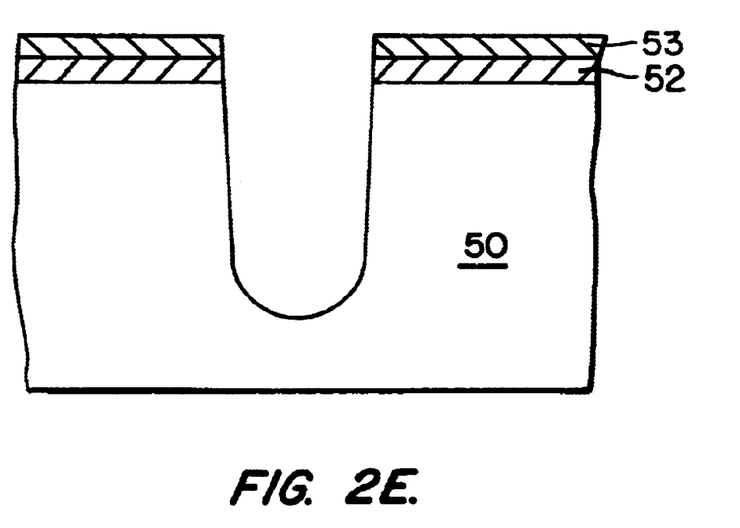
FIG. 2E shows a simplified cross-sectional view of the semiconductor substrate of FIG. 2D after a soft clean step has been performed.

The soft clean step primarily involves a chemical process, i.e., turning off or applying a minimal bias power (e.g., no more than 20 Watts or 0.06 Watt/cm$^2$) to chamber 101 to eliminate or at least minimize further physical etching which produces byproducts. The main trench profile is not meaningfully altered by the soft clean step because passivation layer 56 protects the upper portions of the trench. However, the soft clean step rounds the bottom corners of the trench, as shown in FIG. 2E, because the passivation layer tapers off at those corners. Rounding the bottom corners of the trench improves the step coverage and improves device performance. The soft clean step also removes the damaged layer at the surfaces of the substrate as it removes the byproducts and rounds the bottom corners.

The chemistry of the soft clean step is different than the chemistry of the anisotropic etch step. The soft clean step includes flowing a process gas having one or more halogen sources such as $SF_6$, $CF_4$, $C_2F_6$, $C_3F_8$, $C_4F_8$, $NF_3$ and $CHF_3$. Preferably the process gas also includes a source (e.g., oxygen source) which enhances the dissociation of halogen sources, or an inert gas (e.g., argon) which alters the plasma distribution pattern, or both. The oxygen source and the like enhance dissociation of halogen sources but also produce byproducts. Therefore, the optimal amount of oxygen source or the like for a particular process gas must be determined for the particular process gas used. For example, for one particular soft clean process where the process gas consists essentially of $CF_4$ as the halogen source, the inventors have determined that the optimal gas flow range for $O_2$ is between about 10 percent to about 40 percent of the gas flow rate of $CF_4$, more preferably the gas flow rate for $O_2$ is about 20 percent of the gas flow rate of $CF_4$. An inert gas such as argon may be included in the process gas to more evenly distribute the halogen source within the chamber. The optimal duration of the soft clean step varies for different trench etch processes. For example, the soft clean step generally needs to be run for a longer time for an etch process which generates more byproducts.

Table 5 below provides acceptable ranges for the chamber pressure, bias power, source power, and the like for the soft clean step according to one embodiment of the present invention.

TABLE 5

Process Recipe

Soft Clean Step

| Pressure | 2–100 mT |
|---|---|
| $W_b$ | 0–50 Watts (0–0.16 Watts/cm$^2$) |
| $W_s$ | 300–1,500 Watts |
| $CF_4$ | 10–400 sccm |
| Ar | 0–400 sccm |
| $O_2$ | 0–200 sccm |
| Time | 5–100 sec |

Figures 4A, 4C:
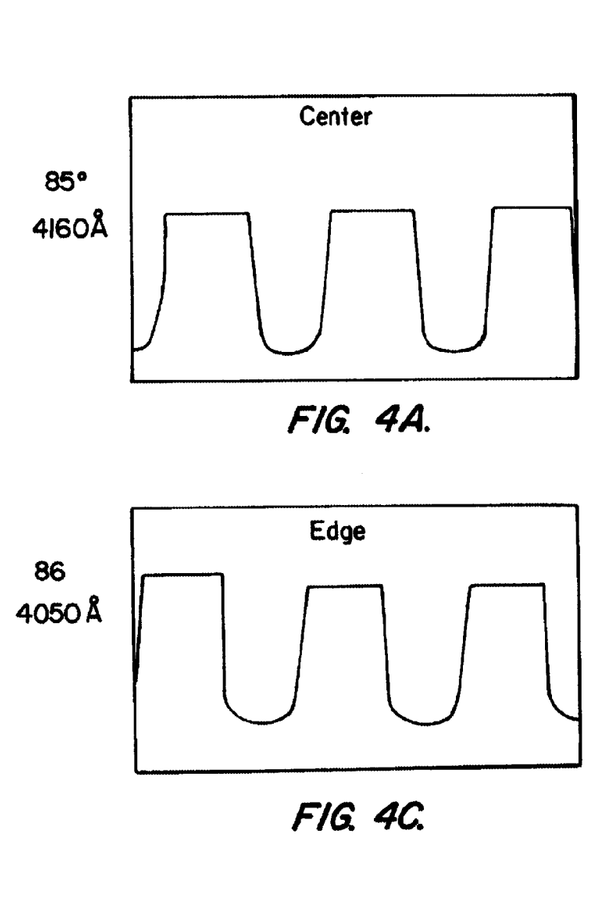
FIG. 4A shows a sketch of an SEM photograph of trench cross-sections in a dense area at the center of the substrate.
FIG. 4C shows a sketch of an SEM photograph of trench cross-sections in a dense area at the edge of the substrate.
Figure 4B:
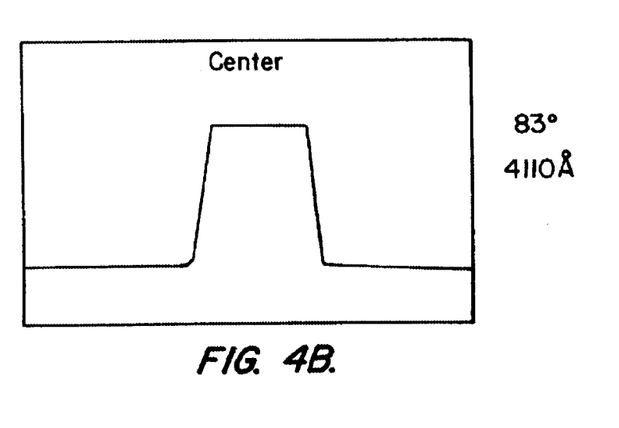
FIG. 4B shows a sketch of an SEM photograph of trench cross-sections in an iso area at the center of the substrate.
Figure 4D:
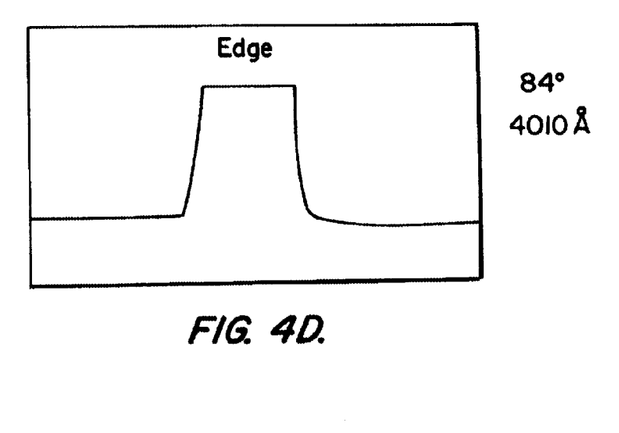
FIG. 4D shows a sketch of an SEM photograph of trench cross-sections in an iso area at the edge of the substrate.

In one experiment, process 200 above was carried out in a DPS+ chamber manufactured by Applied Materials, which is outfitted for eight inch wafers, to examine the micro-loading effects and etch rate uniformity. The targeted trench depth and profile were 4000 Å and 85°, respectively. About 400 wafers were processed using process 200. FIGS. 4A–4D show sketches of SEM photographs of a wafer with typical trench profiles. FIGS. 4A and 4B show sketches of SEM photographs of the trench cross-sections in a dense region and an iso region, respectively, at the center of the substrate. The trench depth and profile at the dense region were 4160 Å and 85°, respectively, whereas the trench depth and profile at the iso region were 4110 Å and 83°, respectively. The etch-rate micro-loading and profile micro-loading effects produced 50 Å and 2° variances, respectively. FIGS. 4C and 4D, on the other hand, show sketches of SEM photographs of the trench cross-sections in a dense region and an iso region, respectively, at the edge of the substrate. The trench depth and profile at the dense region were 4050 Å and 86°, respectively, whereas the trench depth and profile at the iso region were 4010 Å and 84°, respectively. The etch-rate micro-loading and profile micro-loading effects at the edge of the substrate produced 40 Å and 2° variances, respectively. In comparison, the conventional in-situ photoresist approach produces the profile micro-loading variance of 8–10°, and etch-rate micro-loading variance of about 300 Å or more.

The gas flow rates and RF power levels described herein are based on etch processes run in a DPS+ chamber manufactured by Applied Materials that is outfitted for eight inch wafers. A person of ordinary skill in the art will recognize that these values are in part chamber specific and may vary if chambers of other design and/or volume are employed.

While the foregoing is directed to certain preferred embodiments of the present invention, other and further embodiments of the invention may be devised without departing from the basic scope of the invention. For example, one such alternative may employ the soft clean step before the trench etch step. Although the specific embodiments of the present invention have been described above in connection with formation of shallow trench isolation structures, the present invention may be used for other silicon etch processes. These alternatives along with other alternatives and equivalents are intended to be included within the scope of the present invention.

What is claimed is:

1. A method for processing a silicon substrate disposed in a substrate process chamber of the type having a source power system and a bias power system, the method comprising:

providing the substrate having a hard mask formed thereon inside the substrate process chamber, the substrate having a patterned photoresist overlying the hard mask, the patterned photoresist exposing portions of the hard mask;

etching the exposed portions of the hard mask to expose portions of the silicon substrate underlying the hard mask;

thereafter, exposing the patterned photoresist to a first plasma formed from a first process gas to remove the photoresist from the hard mask;

thereafter, etching trenches on the exposed silicon substrate by exposing the substrate to a second plasma formed from a second process gas by applying RF energy from the source power system and biasing the plasma toward the substrate, each of the trenches having particular width, depth, and slope;

exposing the silicon substrate to a third plasma formed from a third process gas including a halogen source in the substrate process chamber without applying bias power or applying bias power of no more than 0.06 Watt/cm$^2$ to remove byproducts in the process chamber, wherein the width, depth, and slope of the trench are not significantly altered by the plasma ignited from the third process gas; and transferring the substrate out of the substrate processing chamber.

2. The method of claim 1, wherein the exposing-the-silicon-substrate-to-a-plasma step is performed before the patterned photoresist is removed.

3. The method of claim 1, wherein the exposing-the-silicon-substrate-to-a-plasma step is performed after the substrate has been etched.

4. The method of claim 1, wherein the exposing-the-patterned-photoresist-to-a-plasma step includes:

maintaining the process chamber at a low pressure while exposing the photoresist to the first plasma;

flowing oxygen gas into the process chamber at no more than 500 sccm;

applying a bias power to the process chamber.

5. The method of claim 4, wherein the process chamber is kept at no more than 50 mT, the oxygen gas is flowed into the process chamber at no more than 100 sccm, and the bias power of no more than about 0.16 Watt/cm$^2$ is applied.

6. A method for forming a trench isolation structure on a silicon substrate disposed in a substrate process chamber of the type having a source power system and a bias power system, the method comprising:

transferring the substrate into the substrate process chamber, the substrate having a hard mask formed thereon and a patterned photoresist overlying the hard mask;

etching a selected portion of the hard mask to expose portions of the silicon substrate underlying the hard mask;

thereafter, removing the photoresist by exposing the photoresist to a plasma ignited within the process chamber;

thereafter, etching the exposed silicon substrate by exposing the substrate to a plasma formed from a first etchant gas by applying RF energy from the source power system and biasing the plasma toward the substrate;

igniting a plasma formed from a second etchant gas including a halogen source in the substrate process chamber without applying bias power or applying no more than 0.16 Watt/cm$^2$ of bias power to remove by products in the process chamber; and transferring the substrate out of the substrate processing chamber.

7. A method for processing a silicon substrate disposed in a substrate process chamber of the type having a source power system and a bias power system, the method comprising:

providing inside the substrate process chamber, the substrate having a hard mask formed thereon and a patterned photoresist overlying the hard mask to expose portions of the hard mask;

etching the exposed portions of the hard mask to expose portions of the silicon substrate underlying the hard mask;

thereafter, exposing the patterned photoresist to a first plasma formed from a first process gas to remove the photoresist from the hard mask;

thereafter, etching trenches on the exposed silicon substrate by exposing the substrate to a second plasma formed from a second process gas by applying RF energy from the source power system and biasing the plasma toward the substrate;

thereafter, exposing the silicon substrate to a third plasma formed from a third process gas including a halogen source in the substrate process chamber without applying bias power or applying bias power of no more than 0.06 Watt/cm$^2$ to remove byproducts in the process chamber; and transferring the substrate out of the substrate processing chamber.

8. The method of claim 7, wherein the exposing-the-silicon-substrate-to-a-plasma step is performed before the patterned photoresist is removed.

9. The method of claim 7, wherein the exposing-the-silicon-substrate-to-a-plasma step is performed after the substrate has been etched.

10. The method of claim 7, wherein the exposing-the-patterned-photoresist-to-a-plasma step includes:

maintaining the process chamber at a low pressure while exposing the photoresist to the first plasma;

flowing oxygen gas into the process chamber at no more than 500 sccm;

applying a bias power to the process chamber.

11. The method of claim 10, wherein the process chamber is kept at no more than 50 mT, the oxygen gas is flowed into the process chamber at no more than 100 sccm, and the bias power of no more than about 0.16 Watt/cm$^2$ is applied.

* * * * *